(12) United States Patent
Jang et al.

(10) Patent No.: US 12,628,578 B2
(45) Date of Patent: May 12, 2026

(54) SUBSTRATE PROCESSING METHOD

(71) Applicant: ASM IP Holding B.V., Almere (NL)

(72) Inventors: Jeonghoon Jang, Hwaseong-si (KR);
Kikang Kim, Yongin-si (KR);
Youngmin Kim, Hwaseong-Si (KR);
Haein Kim, Hwaseong-Si (KR);
Jeunghoon Han, Yongin-si (KR)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/944,132

(22) Filed: Nov. 12, 2024

(65) Prior Publication Data

US 2025/0157811 A1      May 15, 2025

Related U.S. Application Data

(60) Provisional application No. 63/599,004, filed on Nov. 15, 2023.

(51) Int. Cl.
| | |
|---|---|
| *H01L 21/02* | (2006.01) |
| *C23C 16/34* | (2006.01) |
| *C23C 16/455* | (2006.01) |
| *C23C 16/56* | (2006.01) |
| *H01L 21/3065* | (2006.01) |
| *H10P 14/60* | (2026.01) |
| *H10P 14/694* | (2026.01) |
| *H10P 50/24* | (2026.01) |

(52) U.S. Cl.
CPC ........ H10P 14/6336 (2026.01); C23C 16/345 (2013.01); C23C 16/45538 (2013.01); C23C 16/56 (2013.01); H10P 14/6339 (2026.01); H10P 14/69433 (2026.01); H10P 50/242 (2026.01)

(58) Field of Classification Search
None
See application file for complete search history.

(56) References Cited

U.S. PATENT DOCUMENTS

| | | | |
|---|---|---|---|
| 8,647,722 | B2 | 2/2014 | Kobayashi |
| 9,905,415 | B2 | 2/2018 | Chandra |
| 10,378,106 | B2 | 8/2019 | Kobayashi |
| 11,658,035 | B2 | 5/2023 | Lee |
| 2018/0130701 | A1* | 5/2018 | Chun ..................... H10B 41/27 |
| 2019/0259603 | A1* | 8/2019 | Matsuoka ............... C23C 16/56 |
| 2021/0407813 | A1* | 12/2021 | Lee ..................... H01L 21/0228 |

* cited by examiner

*Primary Examiner* — Alexander M Weddle
(74) *Attorney, Agent, or Firm* — Snell & Wilmer L.L.P.

(57) ABSTRACT

Provided is a method of processing a substrate in a reaction chamber, more particularly to a method of increasing a wet etch rate of SiCN layer in order to reduce an overhang from a SiCN layer formed on a stepped structure. The method comprises supplying a carbon-containing silicon source and a nitrogen gas simultaneously while applying a power, followed by performing a post treatment, wherein the wet etch rate of SiCN layer is modulated by the amount of nitrogen source supplied.

19 Claims, 12 Drawing Sheets

PRIOR ART

FIG.4

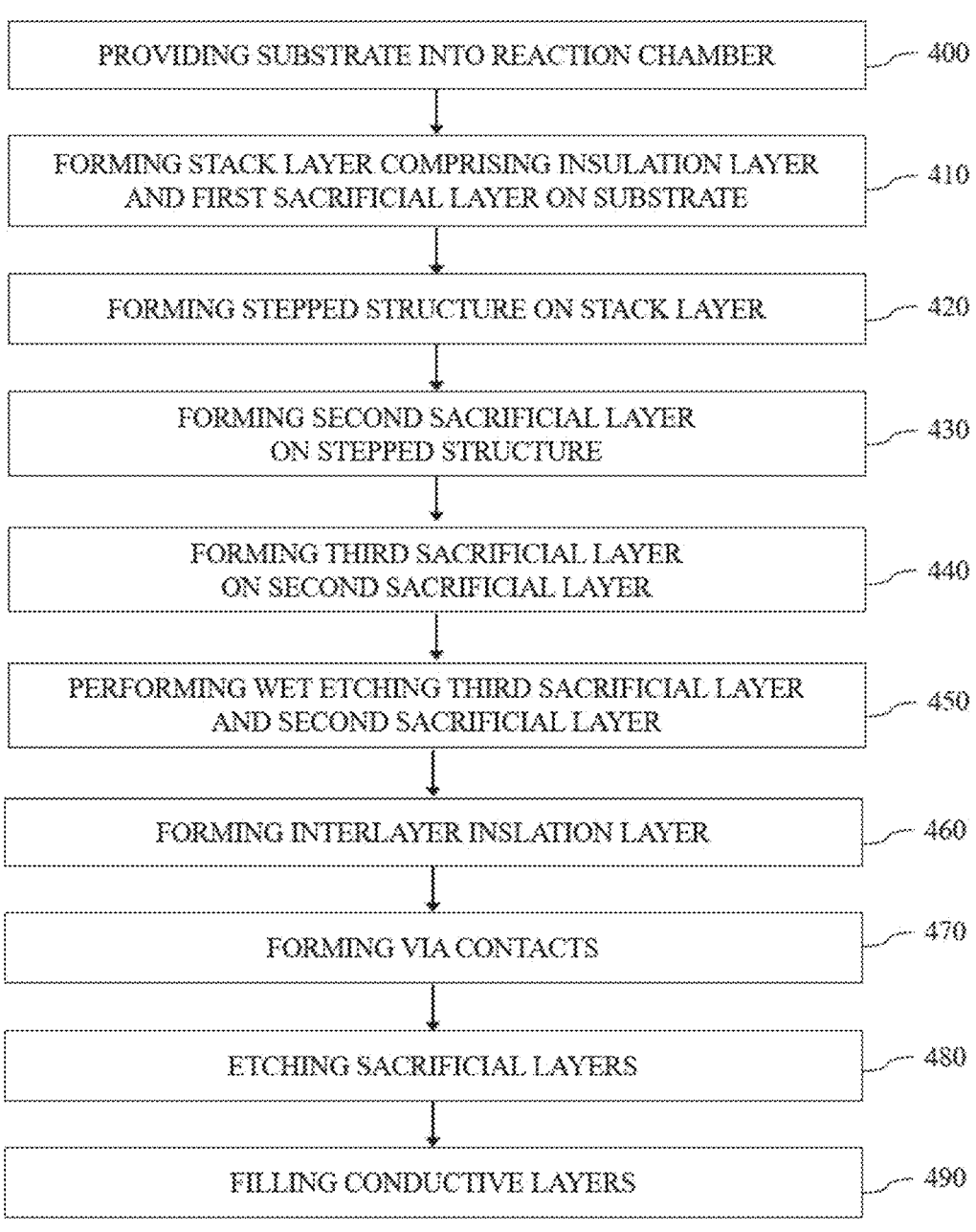

PROVIDING SUBSTRATE INTO REACTION CHAMBER — 400

FORMING STACK LAYER COMPRISING INSULATION LAYER AND FIRST SACRIFICIAL LAYER ON SUBSTRATE — 410

FORMING STEPPED STRUCTURE ON STACK LAYER — 420

FORMING SECOND SACRIFICIAL LAYER ON STEPPED STRUCTURE — 430

FORMING THIRD SACRIFICIAL LAYER ON SECOND SACRIFICIAL LAYER — 440

PERFORMING WET ETCHING THIRD SACRIFICIAL LAYER AND SECOND SACRIFICIAL LAYER — 450

FORMING INTERLAYER INSLATION LAYER — 460

FORMING VIA CONTACTS — 470

ETCHING SACRIFICIAL LAYERS — 480

FILLING CONDUCTIVE LAYERS — 490

SUPPLYING FIRST SILICON SOURCE — 600

SUPPLYING NITROGEN SOURCE — 610

APPLYING FIRST POWER — 620

SUPPLYING SECOND SILICON SOURCE AND NITROGEN SOURCE WHILE APPLYING A SECOND POWER — 700

PERFORMING POST TERATMENT — 710

SUBSTRATE PROCESSING METHOD

CROSS-REFERENCE TO RELATED APPLICATIONS

This application claims priority to U.S. Provisional Patent Application Ser. No. 63/599,004 filed Nov. 15, 2023 titled SUBSTRATE PROCESSING METHOD, the disclosure of which is hereby incorporated by reference in its entirety.

FIELD OF INVENTION

The disclosure relates to a method of processing a substrate in a reaction chamber, more particularly to a method of removing an overhang from a film layer formed on a stepped structure.

BACKGROUND OF THE DISCLOSURE

As the line width of a semiconductor device circuit continues to shrink, a 3D (three dimensional) structure was introduced to a non-volatile semiconductor device for high degree of integration. For instance, by vertically stacking up multiple gate structures, a highly integrated NAND semiconductor device is enabled in a limited space on a substrate. A gate electrode of each gate of 3D NAND semiconductor device is connected to a word line via a via contact hole. To that end, 3D gate electrode is shaped in a form of staircase and each of the gate electrode is connected to the word line through the end of each stair and the via contact hole.

FIG. 1A to FIG. 1I illustrate a conventional method of forming a gate structure of 3D NAND semiconductor device on a stepped structure 10.

In FIG. 1A, a stack layer comprising an insulation layer 100 (100a, 100b, 100c and 100d) and a first sacrificial layer 110 (110a, 110b, 110c and 110d) may be formed and stacked alternately. The insulation layer 100 and the first sacrificial layer 110 may be formed by CVD (Chemical Vapor Deposition) or PECVD (Plasma Enhanced Chemical Vapor Deposition). The insulation layer may comprise $SiO_2$ and the first sacrificial layer may comprise SiN.

In FIG. 1B, a stepped structure 10 may be formed. The stepped structure 10 may be formed via, for instance, reactive ion etching and resist slimming to the stack layer. The stepped structure 10 may comprise an upper surface 120, a side surface 140, and a lower surface 160 connecting the upper surface 120 and the lower surface 160.

In FIG. 1C, a second sacrificial layer 200 may be formed uniformly on the stepped structure 10. The second sacrificial layer 200 may comprise SiN. The second sacrificial layer 200 may be formed using an in-situ plasma by applying a power to a reaction chamber. For instance, the second sacrificial layer may be formed by PEALD (Plasma Enhanced Atomic Layer Deposition). The second sacrificial layer 200 may be a contact pad for via contacts 230 (230a, 230b, 230c and 230d) as shown in FIG. 1G.

In FIG. 1D, a third sacrificial layer 210 may be formed uniformly on the second sacrificial layer 200. The third sacrificial layer 210 may comprise SiCN. The third sacrificial layer 210 may be formed using an in-situ plasma by applying a power to the reaction chamber. For instance, the third sacrificial layer 210 may be formed by PEALD (Plasma Enhanced Atomic Layer Deposition).

The third sacrificial layer 210 may be a mask layer to prevent the via contact from penetrating the contact pad (i.e. a second sacrificial layer 200) into the first sacrificial layer and another first sacrificial layer in the subsequent process as shown in FIG. 2 (e.g. 110b and 110c in FIG. 2). Therefore, the third sacrificial layer 210 may be harder than the second sacrificial layer 200. For instance, the third sacrificial layer 210 may have a wet etch rate lower than that of the second sacrificial layer 200.

It is known that a SiCN layer is harder than a SiN layer. Therefore, a wet etch selectivity between the SiCN layer (i.e. a third sacrificial layer) and the SiN layer (i.e. a second sacrificial layer) may be maintained.

In FIG. 1E, an isotropic etch may be performed. For instance, a wet etch may be performed. As described above, an in-situ plasma may be applied to form the second sacrificial layer 200 and the third sacrificial layer 210. Due to a directionality of the plasma species such as ions, a layer located perpendicular to the moving direction of ions may be densified and hardened by ion-bombardment. That is, a layer formed on the upper surface and a layer formed on the lower surface of the stepped structure may be densified and hardened.

On the contrary, a layer which is located laterally to the moving direction of ions may be less densified and less hardened. That is, a layer formed on the side surface of the stepped structure may be less densified and less hardened than a layer formed on the upper surface and the lower surface. Therefore, a layer formed on the upper surface and the lower surface may remain and a layer formed on the side surface may be removed due to a wet etch selectivity during the wet etch as shown in FIG. 1E.

The third sacrificial layer 210 is a mask layer to protect the second sacrificial layer 200 from being penetrated by via contacts 230 (230a, 230b, 230c and 230d) as shown in FIG. 2. In other words, the third sacrificial layer 210 may be denser and harder than the second sacrificial layer 200. Thus, the wet etch selectivity between the two layers may result in overhang at the end of the third sacrificial layer 210 during the wet etching as denoted as A in FIG. 1E.

In FIG. 1F, an interlayer insulation layer 220 may be formed on the stepped structure 10. The interlayer insulation layer 220 may comprise $SiO_2$ and may be formed by CVD (Chemical Vapor Deposition) or PECVD (Plasma Enhanced Chemical Vapor Deposition).

In FIG. 1G, via contacts 230 (230a, 230b, 230c and 230d) may be formed from the upper surface of the interlayer insulation layer 220 through the mask layer 210 (i.e. the third sacrificial layer 210) formed on the contact pad 200 (i.e. the second sacrificial layer 200). The via contacts may be formed by etching or patterning. As the mask layer 210 is dense and hard, the via contact 230 may not penetrate into the contact pad 200.

In FIG. 1H, the first sacrificial layer 110 (110a, 110b, 110c and 110d), the second sacrificial layer 200 and the third sacrificial layer 210 may be etched, resulting in a space 240 (240a, 240b, 240c and 240d) formed therein.

In FIG. 1I, the space 240 may be filled with a conductive layer 250 (250a, 250b, 250c, 250d). Therefore, a gate channel (not shown herein) may be connected electrically to the word line (not shown herein) via the via contact 230. The conductive layer 250 may be at least one of polysilicon, aluminum, copper and tungsten, or a mixture thereof.

However, an overhang B as shown in FIG. 3A (or an overhang A as shown in FIG. 1E) formed on the third sacrificial layer 210 may contact the neighboring via contacts as shown in FIG. 3B, resulting in short-circuit between via contacts as denoted as C and electrical malfunction of the semiconductor device after filling the via contacts 230 with the conductive layer 250.

SUMMARY OF THE DISCLOSURE

The disclosure discloses relates to a method of processing a substrate in a reaction chamber, more particularly to a method of increasing a wet etch rate of SiCN mask layer in order to reduce an overhang from a SiCN mask layer formed on a stepped structure.

In one or more embodiments, a method of processing a substrate in a reaction chamber comprises providing the substrate into the reaction chamber, forming a stack layer comprising an insulation layer and a first sacrificial layer on the substrate, wherein the insulation layer may comprise $SiO_2$ layer and the first sacrificial layer may comprise SiN layer, forming a stepped structure on the stack layer, wherein the stepped structure comprises an upper surface, a lower surface and a side surface connecting the upper surface and the lower surface, forming a second sacrificial layer on the stepped structure, forming a third sacrificial layer on the second sacrificial layer and performing a wet etching the second sacrificial layer and the third sacrificial layer, wherein the second sacrificial layer may be SiN layer and the third sacrificial layer may be SiCN layer, wherein the second sacrificial layer and the third sacrificial layer may be removed from the side surface of the stepped structure and remain on the upper surface and the lower surface of the stepped structure after the wet etching, wherein a wet etch rate of the third sacrificial layer may be modulated by supplying a nitrogen source during forming the third sacrificial layer.

In one or more embodiments, the second sacrificial layer may be formed by repeating a cycle comprising supplying a first silicon source to the substrate, supplying the nitrogen source as a reactant to the substrate and applying a first power to the reaction chamber to activate the nitrogen source to form a SiN layer on the substrate, wherein the first silicon source may comprise carbon-free constituents.

In one or more embodiments, the first silicon source may comprise at least one of TSA, $(SiH_3)_3N$; DSO, $(SiH_3)_2$; $SiCl_4$; HCD, $Si_2Cl_6$; $Si_3H_8$; DCS, $SiH_2Cl_2$; $SiHI_3$; $SiH_2I_2$; or a mixture thereof.

In one or more embodiments, the nitrogen source may comprise at least one of $N_2$, $NH_3$, $NH_4$, $N_2H_2$, $N_2H_4$, or a mixture thereof.

In one or more embodiments, the third sacrificial layer may be formed by repeating a cycle comprising supplying a second silicon source and the nitrogen source to the substrate simultaneously to form a SiCN layer and modulate a wet etch rate thereof while applying second power to the reaction chamber, performing a post treatment by applying a third power to the reaction chamber, wherein the second silicon source may comprise a carbon constituent.

In one or more embodiments, the second silicon source may comprise at least one of aminosilane, alkoxysilane, alkylsilane, or a mixture thereof.

In one or more embodiments, an overhang may be reduced from a corner of the stepped structure at which the upper surface and the side surface meet during performing the wet etching.

In one or more embodiments, the wet etch rate of the third sacrificial layer may increase as a flowrate of the nitrogen source increases.

In one or more embodiments, the nitrogen source supplied to form the third sacrificial layer may be between about 100 sccm and about 20,000 sccm, more specifically, between about 1,000 sccm and about 5,000 sccm.

In one or more embodiments, the wet etch rate ratio of the third sacrificial layer to the second sacrificial layer may be between about 1:2 and about 1:300, more specifically, between about 1:10 and about 1:100.

In one or more embodiments, a wet etch rate of the second sacrificial layer may be between about 0.2 Å/second and about 20 Å/second, more specifically, between about 0.3 Å/second and about 10 Å/second.

In one or more embodiments, a wet etch rate of the third sacrificial layer may be between about 0.01 Å/second and about 0.3 Å/second, more specifically, between about 0.06 Å/second and about 0.2 Å/second.

In one or more embodiments, the method of processing a substrate in a reaction chamber may further comprise forming an interlayer insulation layer on the stepped structure, forming a via contact through the interlayer insulation layer to the third sacrificial layer, etching the first sacrificial layer, the second sacrificial layer and the third sacrificial layer and filling a space formed by the etching and the via contact with a conductive layer, wherein the conductive layer filling the space is connected to a word line.

BRIEF DESCRIPTION OF THE DRAWING FIGURES

FIGS. 1A to 1I illustrate a conventional method of forming a gate structure of 3D NAND semiconductor device on a stepped structure.

FIG. 4 illustrates a substrate processing method according to an embodiment of the present disclosure.

DETAILED DESCRIPTION OF EXEMPLARY EMBODIMENTS

Figures 1A, 1B, 1C, 1D:
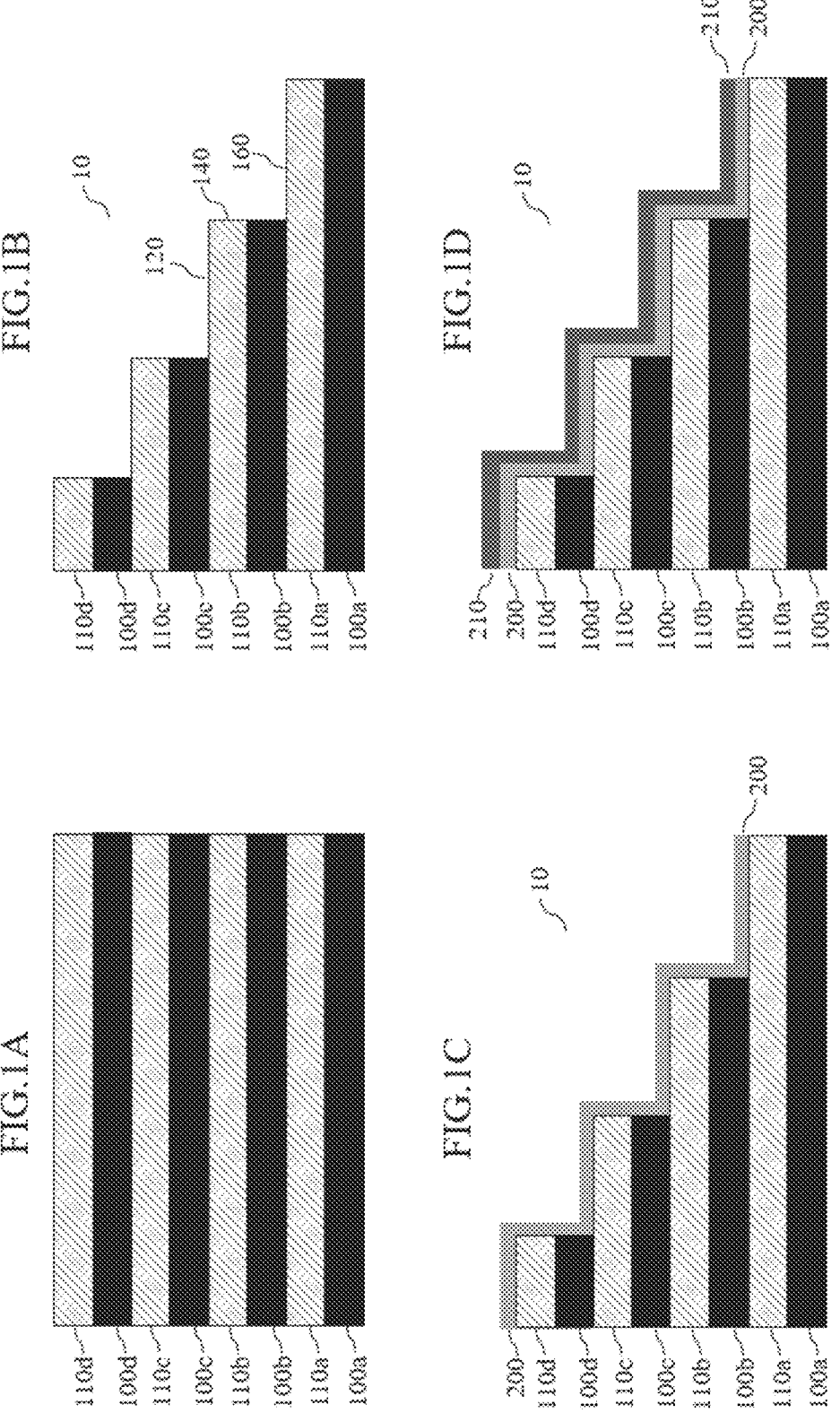

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particularly disclosed embodiments described below.

As used herein, the term "substrate" may refer to any underlying material or materials, including any underlying material or materials that may be modified, or upon which, a device, a circuit, or a film may be formed. The "substrate" may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

The illustrations presented herein are not meant to be actual views of any particular material, structure, or device, but are merely idealized representations that are used to describe embodiments of the disclosure.

The particular implementations shown and described are illustrative of the invention and its best mode and are not intended to otherwise limit the scope of the aspects and implementations in anyway. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

FIG. 4 illustrates a substrate processing method according to the embodiment of the present disclosure.

In step 400, a substrate is provided into a reaction chamber. The substrate may comprise a complex structure, e.g. a recess and 3D gate structure etc. The reaction chamber may be provided with a gas supply unit (e.g., a showerhead) and a substrate support unit (e.g., a heating block with susceptor mounted thereon (not shown herein)). The substrate support unit may be disposed opposite the gas supply unit, facing thereto. A power generator and a matching network may be further provided and connected at least one of the gas supply unit and the substrate supporting unit.

Thus, an in-situ plasma process may be performed in a reaction chamber in order to form a film layer on the substrate.

Figures 1E, 1F, 1G, 1H:
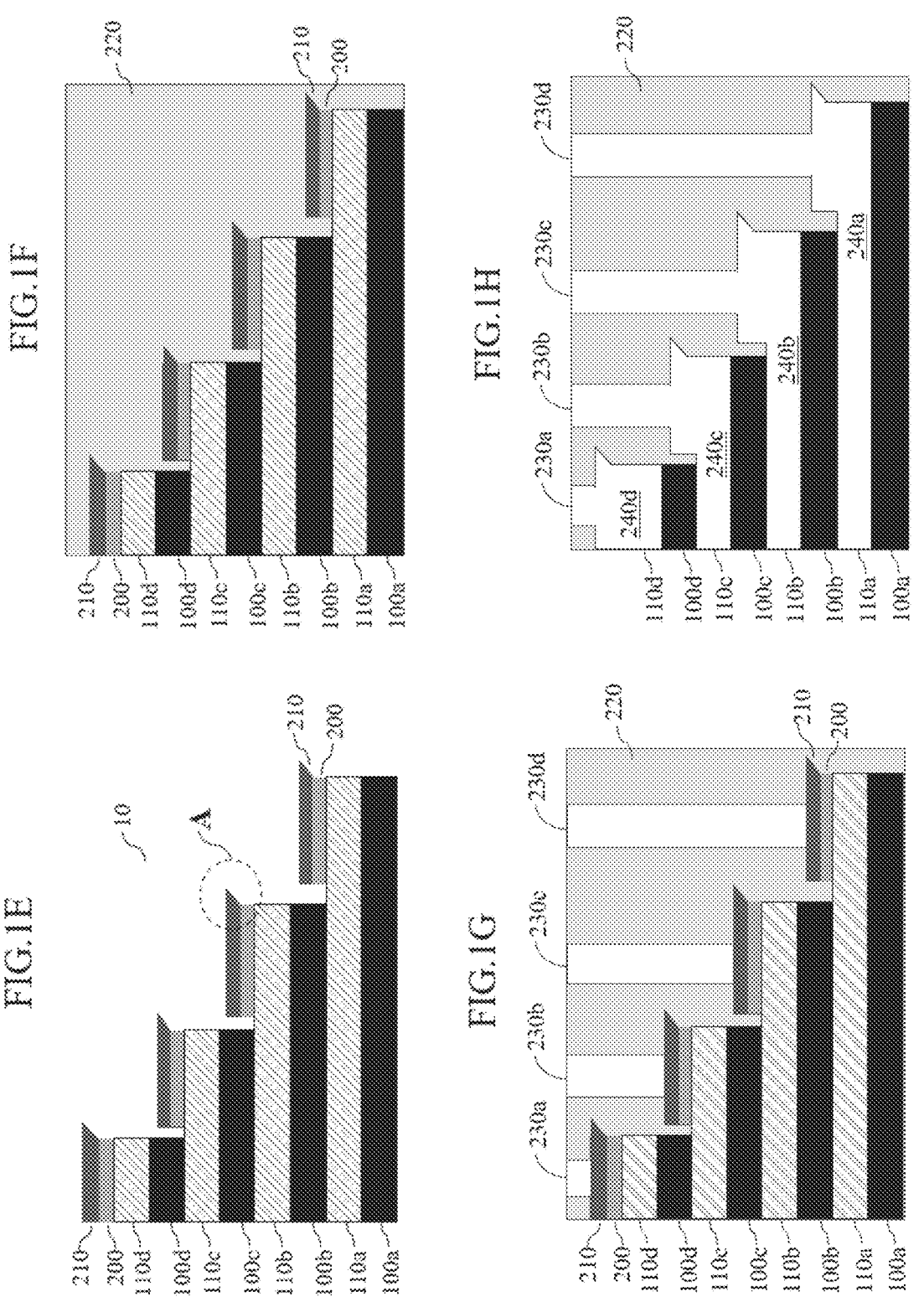
Figure 11:
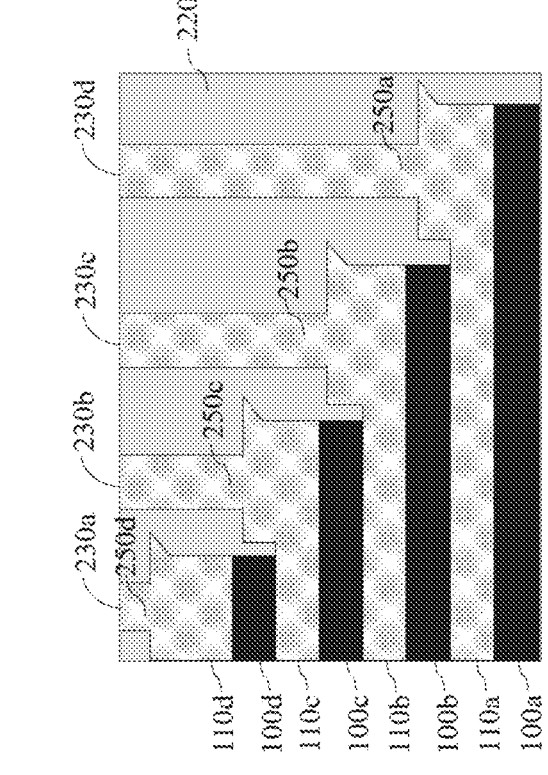

In step 410, a stack layer may be formed on the substrate as shown in FIG. 1A. In the stack layer, an insulation layer and a first sacrificial layer may be formed alternately. The insulation layer may comprise a $SiO_2$ layer and the first sacrificial layer may comprise a SiN layer. The stack layer may be formed by CVD or PECVD. In a subsequent later process, the first sacrificial layer may be etched out and a space in which the first sacrificial layer was formed may be filled with a conductive layer as shown in FIG. 1H and FIG. 1I.

In step 420, a stepped structure may be formed on the stack layer as shown in FIG. 1B. The stepped structure 10 may be formed via, for instance, reactive ion etching and resist slimming to the stack layer. The stepped structure may comprise an upper surface 120, a lower surface 160, and a side surface 140 connecting the upper surface 120 and the lower surface 160.

In step 430, a second sacrificial layer may be formed on the stepped structure as shown in FIG. 1C. The second sacrificial layer 200 may comprise a SiN layer. The second sacrificial layer 200 may be formed using an in-situ plasma by applying a power to a reaction chamber. For instance, the second sacrificial layer may be formed conformally on the stepped structure by PEALD (Plasma Enhanced Atomic Layer Deposition). The second sacrificial layer 200 may be a contact pad for via contacts 230 (230a, 230b, 230c and 230d) later as shown in FIG. 1G.

In an embodiment of the present disclosure, the second sacrificial layer may be formed by supplying a first silicon source and a nitrogen source activated by a power alternately and sequentially, wherein the first silicon source may comprise carbon-free constituents. As the first silicon source comprises carbon-free constituents, the SiN layer (i.e. a second sacrificial layer) may comprise carbon-free constituents accordingly.

The first silicon source may comprise at least one of TSA, $(SiH_3)_3N$; DSO, $(SiH_3)_2$; $SiCl_4$; HCD, $Si_2Cl_6$; $Si_3H_8$; DCS, $SiH_2Cl_2$; $SiHI_3$; $SiH_2I_2$; or a mixture thereof.

The nitrogen source to form the second sacrificial layer may comprise at least one of $N_2$, $NH_3$, $NH_4$, $N_2H_2$, $N_2H_4$, or a mixture thereof.

In step 440, a third sacrificial layer may be formed on the sacrificial layer as shown in FIG. 1D. The third sacrificial layer 210 may comprise SiCN. The third sacrificial layer 210 may be formed using an in-situ plasma by applying a power to the reaction chamber. In an embodiment of the present disclosure, the third sacrificial layer 210 may be formed by Pulsed PECVD (Pulsed Plasma Enhanced Chemical Vapor Deposition).

In an embodiment of the present disclosure, the third sacrificial layer 210 may be formed by supplying a second silicon source and a nitrogen source simultaneously while applying a power, wherein the second silicon source may comprise a carbon constituent to form a SiCN layer when reacting with the nitrogen source.

The second silicon source may comprise at least one of aminosilane, alkoxysilane, alkylsilane, or a mixture thereof. In more specifically, the second silicon source may comprise at least one of DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$;

3DMAS, $SiH(N(Me)_2)_3$; BEMAS, $SiH_2[N(Et)(Me)]_2$; AHEAD, $Si_2(NHEt)_6$; TEAS, $Si(NHEt)_4$; 4MS, $Si(CH_3)_4$, or a mixture thereof.

The nitrogen source to form the third sacrificial layer may comprise at least one of $N_2$, $NH_3$, $NH_4$, $N_2H_2$, $N_2H_4$, or a mixture thereof.

The disclosure found that the nitrogen which is supplied with the second silicon source simultaneously may modulate the wet etch rate of the SiCN layer. That is, as a flowrate of the nitrogen source increases, the wet etch rate of the SiCN layer increases. In an embodiment of the present disclosure, the nitrogen source may be supplied at between about 100 sccm and about 20,000 sccm, more specifically, between about 1,000 sccm and about 5,000 sccm.

It is speculated that a nitrogen may substitute a carbon constituent of SiCN layer and reduce a carbon content therefrom, resulting in reducing the difference of wet etch rate between SiN layer (i.e. the second sacrificial layer) and SiCN layer (i.e. the third sacrificial layer). Therefore, as a flowrate of the nitrogen source increases, the wet etch rate of SiCN layer increases.

The increase of the wet etch rate of SiCN layer may result in low wet etch selectivity between SiCN layer (i.e. a third sacrificial layer) and SiN layer (i.e. a second sacrificial layer). Therefore, an overhang may be reduced during the wet etching later accordingly.

Optionally, a post treatment may be further performed, following forming the SiCN layer. The post treatment may be performed by supplying a power to the reaction chamber and activate the treatment gas. In an embodiment of the present disclosure, an activated nitrogen source may be supplied as a treatment gas to reduce the carbon content further and control the density of SiCN layer.

In step 450, a wet etching to the SiN layer (the second sacrificial layer) and the SiCN layer (the third sacrificial layer) may be performed. The wet etching may be performed by dipping the substrate into a wet etching solution, for instance, 1:100 dHF (diluted hydrogen fluoride).

As shown in FIG. 1E, the SiN/SiCN stack layer may be removed from the side surface of the step and remain on the upper surface and the lower surface of the step. The two layers are formed by in-situ plasma. The layers on the upper surface and the lower surface may be dense and hard by ion bombardment compared to the layers on the side surface. Thus, the layers may be removed from the side surface faster than from the upper surface and the lower surface.

In step 460, an insulation layer may be formed on the stepped structure as shown in FIG. 1F. The insulation layer 220 may comprise $SiO_2$ and may be formed by CVD (Chemical Vapor Deposition) or PECVD (Plasma Enhanced Chemical Vapor Deposition).

Figure 2:
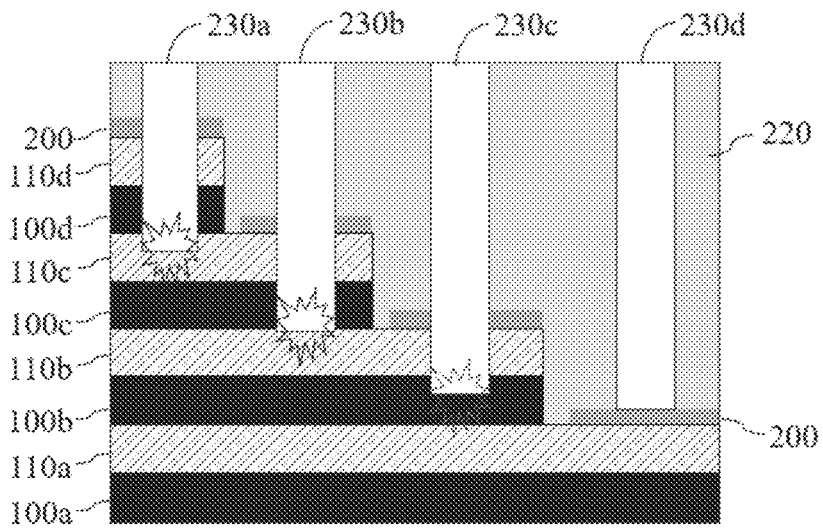
FIG. 2 illustrates via contacts penetrate the contact pad (i.e. a second sacrificial layer) into the first sacrificial layer and another first sacrificial layer through the insulation layer.

In step 470, via contacts may be formed as shown in FIG. 1G. The via contacts 230 (230a, 230b, 230c 230d) may be formed via etching or patterning from the upper surface of the interlayer insulation layer through the SiCN layer (the third sacrificial layer). The SiCN layer may prevent the via contacts 230 from overly etching the contact pad (SiN, the second sacrificial layer) and penetrating into the insulation layer 100 and the first sacrificial layer 110 in the lower steps as shown in FIG. 2.

In step 480, the sacrificial layers comprising the first sacrificial layer 100, the second sacrificial layer 200 and the third sacrificial layer 210 may be etched as shown in FIG. 1H. Therefore, a space 240 (240a, 240b, 240c, 240d) may be formed from the gate channel (not shown herein) to via contacts to a word line (not shown herein) of the 3D NAND gate structure.

In step 490, the space from which the sacrificial layers are etched and the via contacts may be filled with a conductive layer 250 (250a, 250b, 250c, 250d) as shown in FIG. 1I. Therefore, a gate channel may be connected electrically to the word line via the via contact 230. The conductive layer 250 may be at least one of polysilicon, aluminum, copper and tungsten, or a mixture thereof.

Figure 5B:
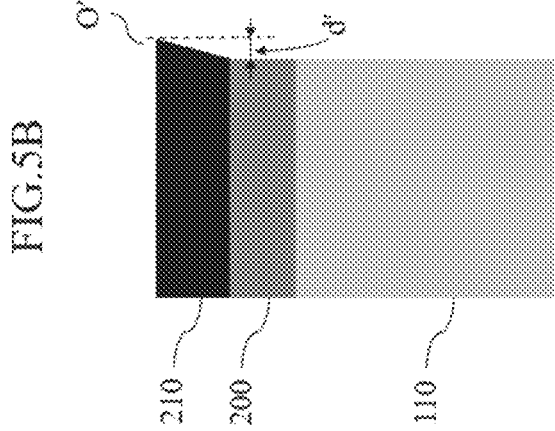
FIG. 5B illustrates the overhang formed when the SiCN layer is formed by the Pulsed PECVD method, followed by being etched according to an embodiment of the present disclosure.
Figure 5A:
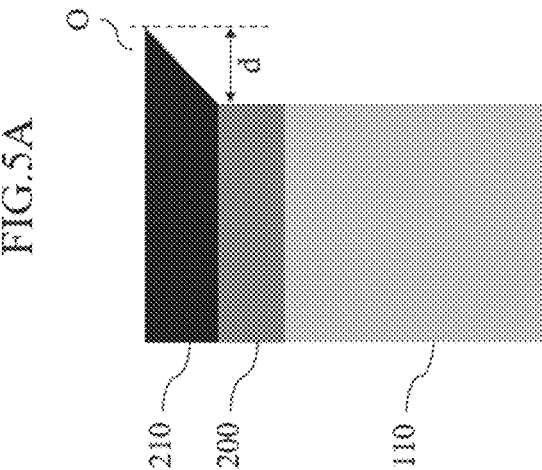
FIG. 5A illustrates the overhang formed when the SiCN layer is formed by the PEALD method, followed by being etched according to a conventional method.

FIG. 5A illustrates the overhang formed when the SiCN layer 210 is formed by the PEALD method, followed by being etched according to a conventional method.

FIG. 5B illustrates the overhang formed when the SiCN layer 210 is formed by the Pulsed PECVD method, followed by being etched according to an embodiment of the present disclosure.

Figure 3A:
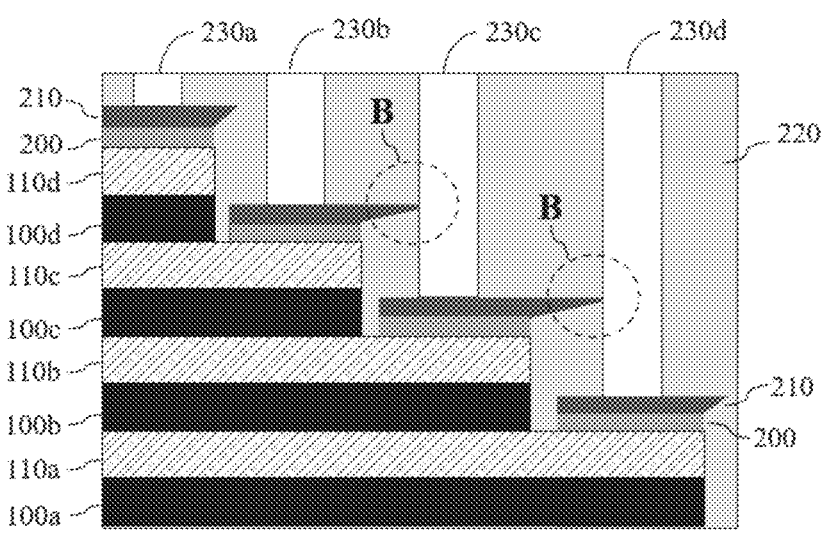
FIG. 3A illustrates an overhang formed on the third sacrificial layer.
Figure 3B:
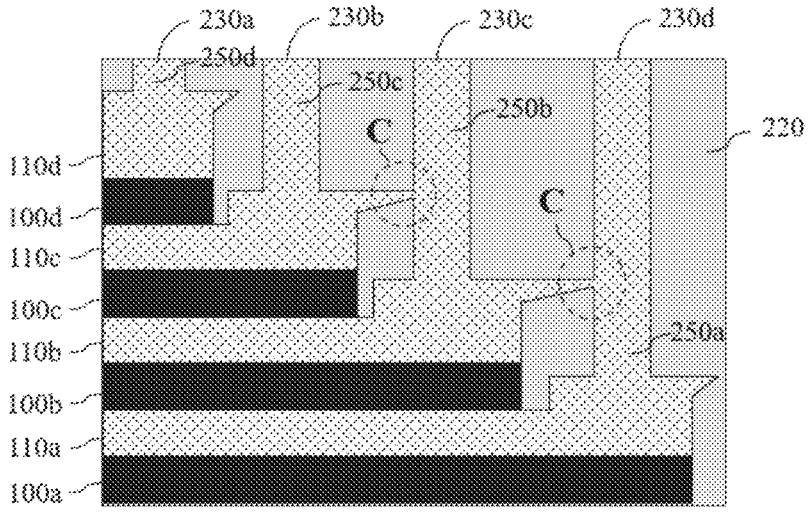
FIG. 3B illustrates a via contact touching a neighboring via contact, resulting in a short-circuit in a gate structure.

Compared FIG. 5A and FIG. 5B, the overhang O' formed on the SiCN layer 210 in FIG. 5B is less protruded than the overhang O formed on the SiCN layer 210 in FIG. 5A (d'<d). Therefore, the present disclosure provides a technical advantage that the contacts between the overhangs and the via contacts as shown FIG. 3A and the short circuits between via contacts shown in FIG. 3B may be prevented.

Figure 6A:
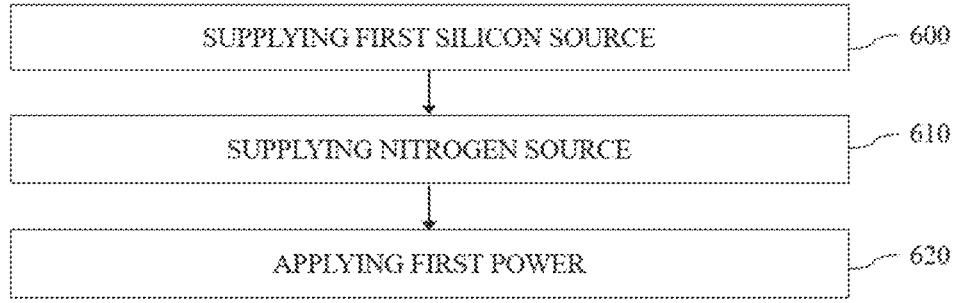
FIG. 6A illustrates a method for forming a second sacrificial layer.

FIG. 6A illustrates a method for forming a second sacrificial layer, that is, a SiN layer, corresponding to the step 430 of FIG. 4.

In step 600, a first silicon source may be supplied to the substrate provided to the reaction chamber. The first silicon source may comprise carbon-free constituents. For instance, the first silicon source may comprise at least one of TSA, $(SiH_3)_3N$; DSO, $(SiH_3)_2$; $SiCl_4$; HCD, $Si_2Cl_6$; $Si_3H_8$; DCS, $SiH_2Cl_2$; $SiHI_3$; $SiH_2I_2$; or a mixture thereof.

In step 610, a nitrogen source may be supplied. The nitrogen source may comprise at least one of $N_2$, $NH_3$, $NH_4$, $N_2H_2$, $N_2H_4$, or a mixture thereof.

In step 620, a first power may be applied to the reaction chamber to activate the nitrogen source and generate a nitrogen plasma. The first silicon source and the activated nitrogen source may react to form a SiN layer on the substrate.

The first power may comprise a high frequency RF power (HRF). Optionally, the first power may further comprise a low frequency RF power (LRF), that is, comprising a dual frequency RF power. The HRF may be between about 30 W and about 1,200 W, more specifically between about 50 W and about 250 W at RF frequency of between about 10 MHz and about 100 MHz for high frequency. The LRF may be between about 30 W and about 1,200 W, more specifically between about 50 W and about 250 W at RF frequency of between about 10 kHz and about 250 kHz.

The steps 610 and 620 may be performed simultaneously or sequentially. The steps 600 to 620 may be repeated a plurality of times until a target thickness is achieved.

Figure 6B:
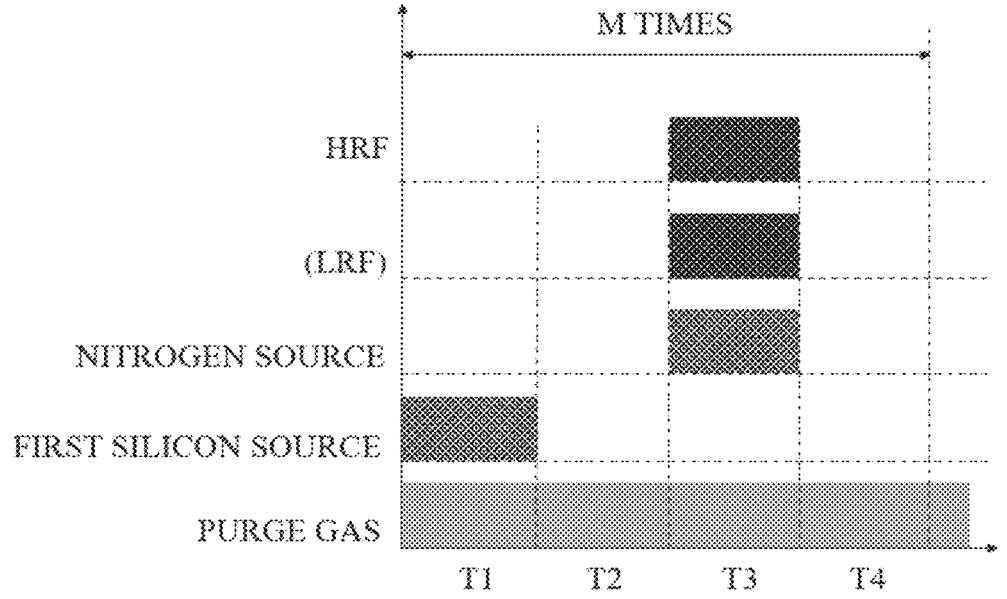
FIG. 6B illustrates a timing graph for FIG. 6A.

FIG. 6B illustrates a timing graph of FIG. 6A. In FIG. 6B, a purge gas such as inert gas (i.e., Ar, He) may be supplied continuously throughout the cycle from T1 to T4. The steps T1 to T4 may be repeated a plurality of times (M times). Optionally, the nitrogen source may be supplied continuously throughout the cycle from T1 to T4. In FIG. 6B, the LRF may be further applied optionally.

Figure 7A:
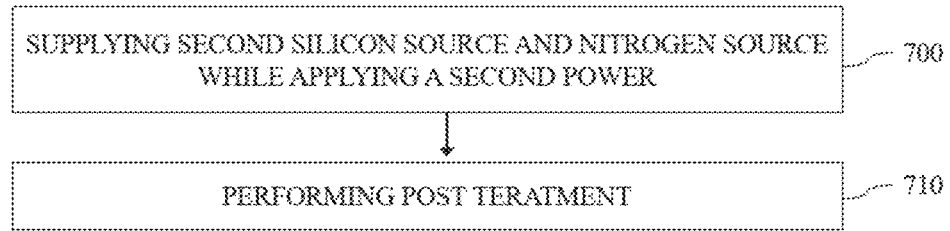
FIG. 7A illustrates a method for forming a third sacrificial layer.

FIG. 7A illustrates a method for forming a third sacrificial layer, that is, a SiCN layer, corresponding to the step 440 of FIG. 4.

In step 700, a second silicon source and a nitrogen source may be supplied simultaneously to the substrate provided to the reaction chamber while applying a second power to the reaction chamber. The second silicon source may comprise a carbon constituent. For instance, the second silicon source may comprise at least one of comprise at least one of aminosilane, alkoxysilane, alkylsilane, or a mixture thereof. In more specifically, the second silicon source may comprise at least one of DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; 4MS, $Si(CH_3)_4$, or a mixture thereof.

The nitrogen source supplied in step 700 may comprise at least one of $N_2$, $NH_3$, $NH_4$, $N_2H_2$, $N_2H_4$, or a mixture thereof. The nitrogen source may be suppled at between about 100 sccm and about 20,000 sccm, more specifically at between about 1,000 sccm and about 5,000 sccm.

The second power applied in step 700 may comprise a high frequency RF power (HRF). Optionally, the second power may further comprise a low frequency RF power (LRF), that is, comprising a dual frequency RF power. The HRF may be between about 30 W and about 1,200 W, more specifically between about 50 W and about 300 W at RF frequency of between about 10 MHz and about 100 MHz for high frequency. The LRF may be between about 30 W and about 1,200 W, more specifically between about 50 W and about 300 W at RF frequency of between about 10 kHz and about 500 kHz.

In step 710, a post treatment may be performed. In an embodiment of the present disclosure, the post treatment may be performed by applying a third power to the reaction chamber while supplying a treatment gas. In an embodiment of the present disclosure, an activated nitrogen source may be supplied as a treatment gas.

The third power applied in step 710 may comprise a high frequency RF power (HRF). Optionally, the third power may further comprise a low frequency RF power (LRF), that is, comprising a dual frequency RF power. The third power may be the same as the second power, or greater than the second power.

The HRF may be between about 30 W and about 1,200 W, more specifically between about 50 W and about 500 W at RF frequency of between about 10 MHz and about 100 MHz for high frequency. The LRF may be between about 30 W and about 1,200 W, more specifically between about 50 W and about 500 W at RF frequency of between about 10 kHz and about 500 kHz.

Figure 7B:
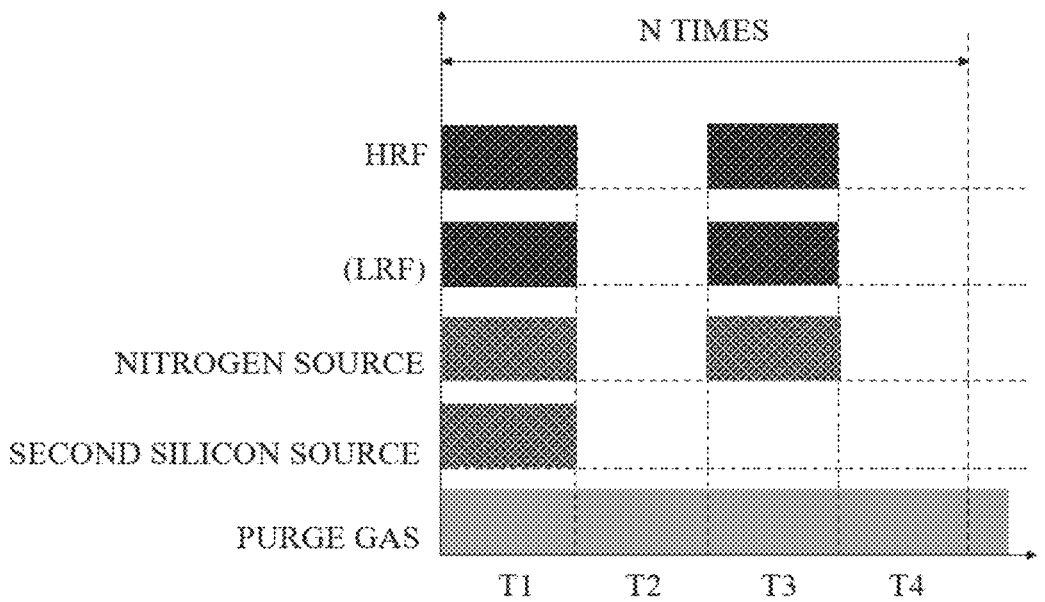
FIG. 7B illustrates a timing graph for FIG. 7A.

FIG. 7B illustrates a timing graph of FIG. 7A. In FIG. 7B, a purge gas such as inert gas (i.e. Ar, He) may be supplied continuously throughout the cycle from T1 to T4. The steps T1 to T4 may be repeated a plurality of times (N times). Optionally, the nitrogen gas may be supplied throughout the cycle from T1 to T4. In FIG. 7B, the LRF may be further applied optionally. In FIG. 7B, the SiCN layer may be formed at T1, followed by post treatment at T3.

Figure 8:
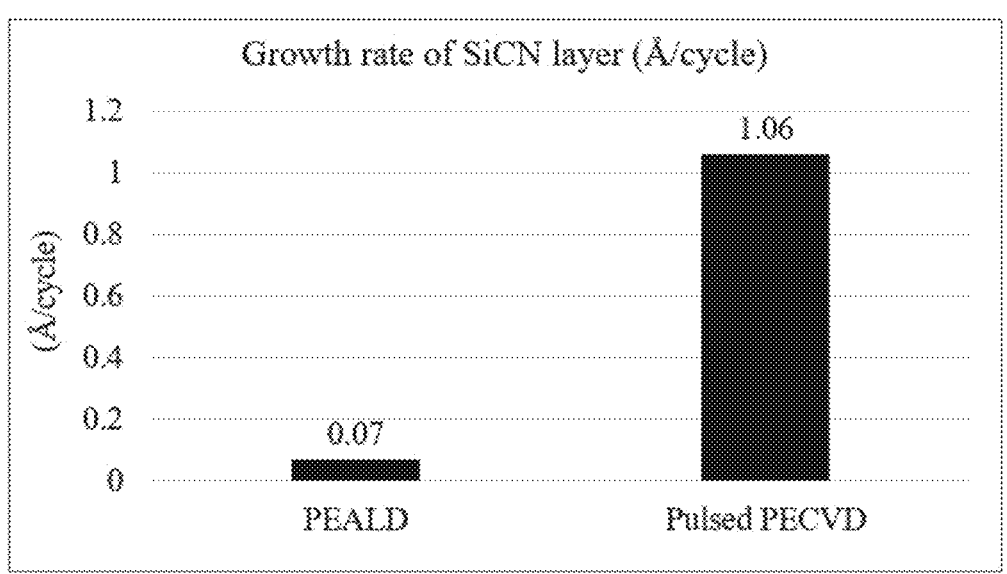
FIG. 8 illustrates a growth rate of SiCN layer formed by a conventional PEALD method and a pulsed PECVD method.

FIG. 8 illustrates a growth rate of SiCN layer formed by a conventional PEALD method and a pulsed PECVD method. The pulsed PECVD method according to the present disclosure may have another advantage of high growth rate of SiCN layer compared to the conventional PEALD method as shown in FIG. 8. Thus, a substrate processing speed (e.g. throughput) may increase.

Figure 9A:
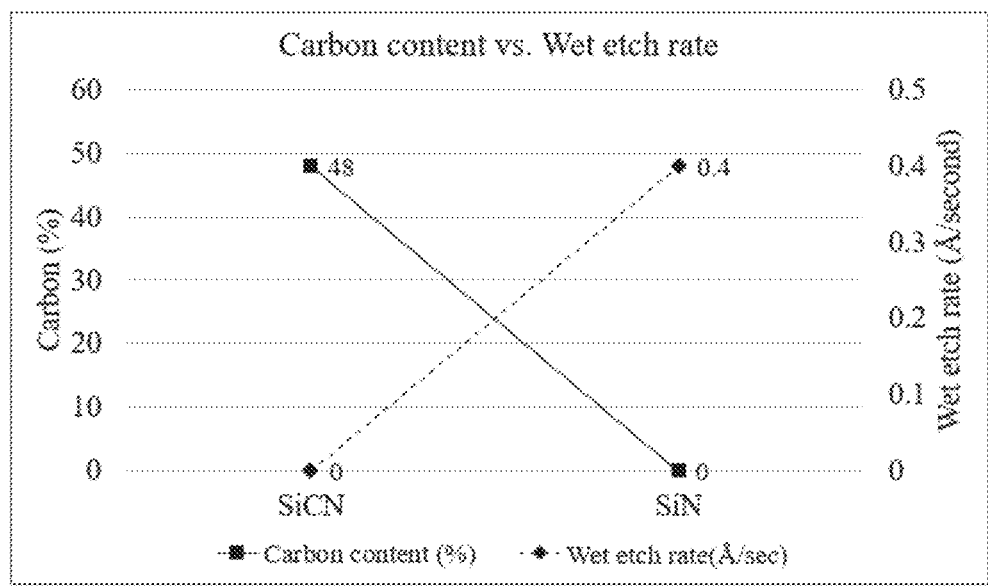
FIG. 9A illustrates relations between carbon contents and wet etch rates of the SiCN layer prepared by PEALD method and the SiN layer prepared by PEALD method.

FIG. 9A illustrates relations between carbon contents and wet etch rates of the SiCN layer (i.e. a third sacrificial layer) prepared by PEALD method and the SiN layer (i.e. a second sacrificial layer) prepared by PEALD method.

In FIG. 9A, the SiCN layer contains about 48% of carbon and the wet etch rate thereof is about 0 Å/second. On the contrary, the SiN layer contains about 0% of carbon and the wet etch rate thereof is about 0.4 Å/second. Thus, the wide wet etch selectivity (i.e. 0 Å/second vs. 0.4 Å/second) may result in an overhang on the SiCN layer after the wet etching.

Figure 9B:
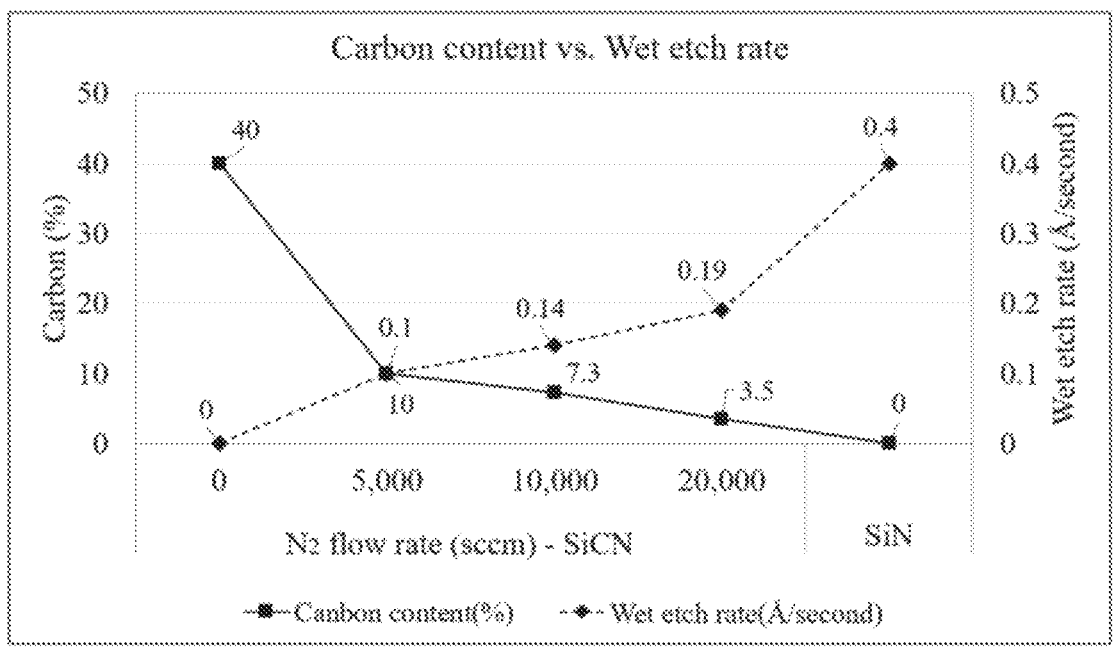
FIG. 9B illustrates relations between carbon contents and wet etch rates of the SiCN layer prepared by Pulsed PECVD method according to an embodiment of the present disclosure and the SiN layer prepared by PEALD method.

FIG. 9B illustrates relations between carbon contents and wet etch rates of the SiCN layer (i.e. a third sacrificial layer) prepared by Pulsed PEALD method according to an embodiment of the present disclosure and the SiN layer (i.e. a second sacrificial layer) prepared by PEALD method.

In FIG. 9B, as the flowrate of nitrogen increases from 0 sccm to 20,000 sccm, the carbon content of SiCN layer decreases from 40% to 3.5% and the wet etch rate of SiCN layer increases from 0 Å/second to 0.19 Å/second respectively. Compared to the wet etch rate of SiN layer of which wet etch rate is 0.4 Å/second, the wet etch rate of SiCN layer increases up to 0.19 Å/second, almost 50% of the wet etch rate of SiN layer.

Therefore, FIG. 9A and FIG. 9B demonstrate that the wet etch rate of SiCN layer (i.e. a third sacrificial layer) may increase more effectively by supplying the nitrogen source according to the pulsed PECVD method of the present disclosure compared to the conventional PEALD method. In other words, the difference of wet etch selectivity between SiCN layer and SiN layer may be reduced more effectively. Thus, an overhang may be reduced more effectively from the SiCN layer and the interference with neighboring via contacts may be prevented.

In an embodiment according to the present disclosure, the wet etch ratio of SiCN layer, the third sacrificial layer, to SiN layer, the second sacrificial layer may be between about 1:2 and about 1:300, more specifically between about 1:10 and 1:100 in order to reduce the overhang and the interference between the overhangs and the neighboring via contacts.

In an embodiment according to the present disclosure, the wet etch rate of SiN, the second sacrificial layer, may be between about 0.2 Å/second and about 20 Å/second, more specifically between about 0.3 Å/second and about 10 Å/second. And the wet etch rate of SiCN, the third sacrificial layer, may be between about 0.01 Å/second and about 0.3 Å/second, more specifically between about 0.06 Å/second and about 0.2 Å/second.

Table 1 is test conditions for forming SiN layer, the second sacrificial layer, and Table 2 is test conditions for forming SiCN layer, the third sacrificial layer, followed by post treatment according to an embodiment of the present disclosure.

TABLE 1

| Test conditions for forming SiN layer according to an embodiment of the present disclosure | | |
|---|---|---|
| Process parameters | | Conditions |
| Process time per step (second) | Source feeding | 0.2 to 1 (preferably 0.4 to 0.8) |
| | Purge | 0.2 to 1 (preferably 0.3 to 0.8) |
| | RF on | 0.5 to 2.5 (preferably 0.8 to 2.2) |
| | Purge | 0.1 to 1 (preferably 0.2 to 0.8) |
| Gas flow rate (slm) | Silicon source (halide) | 0.1 to 2.5 (preferably 0.4 to 2.2) |
| | $N_2$ | 0.5 to 8(preferably 0.8 to 6) |
| | $NH_3$ | 0.5 to 8 (preferable 0.8 to 6) |
| | Ar | 5 to 20 (preferably 8 to 18) |
| RF power (W) | HRF (10 MHz to 100 MHz) | 300 to 1200 (preferably 50 to 250) |
| Pressure (Torr) | | 2 to 4 |
| Temperature (° C.) | | 300 to 600 (preferably 400 to 500) |

TABLE 2

Test conditions for forming SiCN layer, followed by post treatment according to an embodiment of the present disclosure

| Process parameters | | Conditions |
|---|---|---|
| Process time per step (second) | Source feeding/ RF on | 0.1 to 1 (preferably 0.2 to 0.8) |
| | Purge | 0.1 to 1 (preferably 0.2 to 0.8) |
| | RF on (Post treatment) | 0.2 to 5 (preferably 0.4 to 4) |
| | Purge | 0.1 to 1 (preferably 0.2 to 0.8) |
| Gas flow rate (slm) | Silicon source (aminosilane) | 0.5 to 2.5 (preferably 1 to 2) |
| | $N_2$ | 0.1 to 20(preferably 1 to 5) |
| | Ar | 5 to 20 (preferably 8 to 18) |
| RF power (W) for SiCN | HRF | 300 to 1200 (preferably 50 to 300) |
| RF power (W) for post treatment | HRF (10 MHz to 100 MHz) | 300 to 1200 (preferably 50 to 500) |
| | Pressure (Torr) | 2 to 4 |
| | Temperature (° C.) | 300 to 600 (preferably 400 to 500) |

The invention claimed is:

1. A method of processing a substrate in a reaction chamber, comprising:

providing the substrate into the reaction chamber;

forming a stack layer comprising an insulation layer and a first sacrificial layer on the substrate;

forming a stepped structure on the stack layer, wherein the stepped structure comprises an upper surface, a lower surface and a side surface connecting the upper surface and the lower surface;

forming a second sacrificial layer on the stepped structure;

forming a third sacrificial layer on the second sacrificial layer; and performing a wet etching to remove the second sacrificial layer and the third sacrificial layer from the side surface, so that the second sacrificial layer and the third sacrificial layer remain on the upper surface and the lower surface, wherein a wet etch rate of the third sacrificial layer is modulated by supplying a nitrogen source during forming the third sacrificial layer, and wherein the insulation layer is a $SiO_2$ layer and the first sacrificial layer is a SiN layer, and wherein the third sacrificial layer is a SiCN layer formed by repeating a cycle comprising:

supplying a second silicon source and the nitrogen source to the substrate simultaneously to form the SiCN layer while applying a second power to the reaction chamber, wherein the second silicon source comprises a carbon constituent, and a wet etch rate of the SiCN layer is modulated by reducing a carbon constituent by supplying the nitrogen source, and performing a post treatment by applying a third power to the reaction chamber, wherein the nitrogen source is further supplied during the post treatment.

2. The method of claim 1, wherein the second sacrificial layer is a SiN layer formed by repeating a cycle comprising:

supplying a first silicon source to the substrate;

supplying the nitrogen source as a reactant to the substrate; and applying a first power to the reaction chamber to activate the nitrogen source, wherein the first silicon source comprises carbon-free constituents.

3. The method of claim 2, wherein the first silicon source comprises at least one of TSA, $(SiH_3)_3N$; DSO, $(SiH_3)_2$; $SiCl_4$; HCD, $Si_2Cl_6$; $Si_3H_8$; DCS, $SiH_2Cl_2$; $SiHI_3$; $SiH_2I_2$; or a mixture thereof.

4. The method of claim 2, wherein the nitrogen source comprises at least one of $N_2$, $NH_3$, $NH_4$, $N_2H_2$, $N_2H_4$, or a mixture thereof.

5. The method of claim 2, wherein the first power is a high frequency power at between about 30 W and about 1,200 W.

6. The method of claim 1, wherein the nitrogen source is supplied at between about 100 sccm and about 20,000 sccm during forming the SiCN layer.

7. The method of claim 1, wherein an overhang is reduced from the stepped structure.

8. The method of claim 1, wherein the second silicon source comprises at least one of aminosilane, alkoxysilane, alkylsilane, or a mixture thereof.

9. The method of claim 8, wherein the second silicon source comprises at least one of DSMA, $(SiH_3)_2NMe$; DSEA, $(SiH_3)_2NEt$; DSIPA, $(SiH_3)_2N$ (iPr); DSTBA, $(SiH_3)_2$ N (tBu); DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N$ $(iPr)_2$; TEOS, $Si(OEt)_4$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; 4 MS, $Si(CH_3)_4$, or a mixture thereof.

10. The method of claim 1, wherein the nitrogen source comprises at least one of $N_2$, $NH_3$, $NH_4$, $N_2H_2$, $N_2H_4$, or a mixture thereof.

11. The method of claim 1, wherein the second power is between about 30 W and about 1,200 W.

12. The method of claim 1, wherein the third power is between about 30 W and about 1,200 W.

13. The method of claim 1, wherein the second power and the third power comprise a high frequency power and a low frequency power.

14. The method of claim 1, wherein the wet etch rate ratio of the third sacrificial layer to the second sacrificial layer is between about 1:2 and about 1:300.

15. The method of claim 14, wherein the wet etch rate ratio of the third sacrificial layer to the second sacrificial layer is between about 1:10 and about 1:100.

16. The method of claim 1, wherein a wet etch rate of the second sacrificial layer is between about 0.2 Å/second and about 20 Å/second.

17. The method of claim 1, wherein a wet etch rate of the third sacrificial layer is between about 0.01 Å/second and about 0.3 Å/second.

18. The method of claim 1, further comprising supplying an inert gas continuously to purge the reaction chamber while forming the second sacrificial layer and the third sacrificial layer.

19. The method of claim 1, further comprising:

forming an interlayer insulation layer on the stepped structure;

forming a via contact through the interlayer insulation layer to the third sacrificial layer;

etching the first sacrificial layer, the second sacrificial layer and the third sacrificial layer; and filling a space formed by the etching and the via contact with a conductive layer, wherein the conductive layer comprises at least one of polysilicon, aluminum, copper and tungsten, or a mixture thereof.

* * * * *